US006175244B1

(12) United States Patent
Gattiker et al.

(10) Patent No.: US 6,175,244 B1
(45) Date of Patent: Jan. 16, 2001

(54) CURRENT SIGNATURES FOR IDDQ TESTING

(75) Inventors: Anne Elizabeth Gattiker, Chambersburg; Wojciech Maly, Pittsburgh, both of PA (US)

(73) Assignee: Carnegie Mellon University, Pittsburgh, PA (US)

( * ) Notice: Under 35 U.S.C. 154(b), the term of this patent shall be extended for 0 days.

(21) Appl. No.: 08/842,992

(22) Filed: Apr. 25, 1997

(51) Int. Cl.[7] .................................................. G01R 31/06
(52) U.S. Cl. ............................................................ 324/765
(58) Field of Search .............................. 324/158.1, 73.1, 324/763, 765, 766, 767, 769; 371/22.1, 22.4, 22.6, 22.3; 327/401; 714/733, 736

(56) References Cited

U.S. PATENT DOCUMENTS

| | | | |
|---|---|---|---|
| 4,710,704 | 12/1987 | Ando | 324/73 |
| 4,727,318 | 2/1988 | Sakai et al. | 324/158 |
| 4,808,915 | 2/1989 | Russell | 324/73 |
| 4,820,974 | 4/1989 | Katsura et al. | 324/73 |
| 4,835,458 | 5/1989 | Kim | 324/73 |
| 5,025,344 | * 6/1991 | Maly et al. | 324/73.1 |
| 5,057,774 | 10/1991 | Verhelst et al. | 324/158 |
| 5,059,889 | 10/1991 | Heaton | 323/285 |
| 5,321,354 | 6/1994 | Ooshima et al. | 324/158 |
| 5,332,973 | * 7/1994 | Brown et al. | 324/537 |
| 5,371,457 | 12/1994 | Lipp | 324/158.1 |
| 5,392,293 | 2/1995 | Hsue | 371/15.1 |
| 5,410,547 | 4/1995 | Drain | 371/22.4 |
| 5,459,737 | 10/1995 | Andrews | 371/22.5 |
| 5,467,026 | 11/1995 | Arnold | 326/16 |
| 5,481,551 | 1/1996 | Nakano et al. | 371/27 |
| 5,483,170 | 1/1996 | Beasley et al. | 324/537 |
| 5,552,744 | * 9/1996 | Burlison et al. | 327/401 |
| 5,670,892 | * 9/1997 | Sporck | 324/765 |
| 5,731,700 | * 3/1998 | McDonald | 324/765 |
| 5,889,408 | 3/1999 | Miller | 324/765 |
| 5,914,615 | * 6/1999 | Chess | 324/73.1 |

OTHER PUBLICATIONS

Sreejit Chakravarty, Minsheng Liu, "Algorithms for Current Monitor Based Diagnosis of Bridging and Leakage Faults," 29th ACM/IEEE Design Automation Conference, Paper No. 22.6, pp. 353–356, © 1992 IEEE (Month Unavailable).

(List continued on next page.)

*Primary Examiner*—Vinh P. Nguyen
(74) *Attorney, Agent, or Firm*—Townsend and Townsend and Crew LLP; Henry K. Woodward

(57) ABSTRACT

A method of using static power supply current in response to test vectors for acceptance testing and defect diagnosis of CMOS integrated circuit die. Testing is based on comparison of two or more power supply current measurements from the die under test. Defect diagnosis is based on characterizing a defect by one or more current levels produced by the circuit in the presence of the defect.

13 Claims, 3 Drawing Sheets

OTHER PUBLICATIONS

R. Rodríguez–Montañés, J.A. Segura, V.H. Champac, J. Figueras, J.A.Rubio, "Current vs. Logic Testing of Gate Oxide Short, Floating Gate and Bridging Failures in CMOS," Univ. Politècnica de Catulunya, Eng. Electrònica, Diagonal 649, p9, 08028 Barcelona, Univ. de les Illes Balears, Dept. de Físcica, Crta. de Valldemossa, 07071 Palma, Spain, International Test Conference 1991, Paper No. 19.3, pp. 510–519, © 1991 IEEE (Month Unavailable).

Samir Naik (Carnegie Mellon University), Frank Agricola (Philips Semiconductors), Wojciech Maly (Carnegie Mellon University), "Failure Analysis of High Density CMOS SRAMs Using Realistic Defect Modeling and $I_{DDQ}$ Testing," *IEEE Design & Test of Computers*, pp. 13–23, ©Jun. 1993 IEEE.

[1]H. Balachandran and [2]D.M.H. Walker, [1]Department of Electrical Eng., Texas A&M University, College Station, TX 77843, [2]Department of Computer Science, Texas A&M University, College Station, TX 77843, "Improvement of SRAM–Based Failure Analysis Using Calibrated Iddq Test," 14th VLSI Test Symposium—1996, pp. 130–136 (Month Unavailable).

Jitendra B. Khare, Student Member, IEEE, Wojciech Maly, Fellow, IEEE, Susanne Griep, and Doris Schmitt–Landsiedel, "Yield–Oriented Computer–Aided Defect Diagnosis," *IEEE Transactions on Semiconductor Manufacturing*, vol. 8, No. 2, May 1995, pp. 195–206.

Young–Jun Kwon and D. M. H. Walker, "Yield Learning via Functional Test Data,"Department of Computer Science, Texas A&M University, College Station, TX 77843, International Test Conference, Paper No. 27.2, pp. 626–635, © 1995 IEEE (Month Unavailable).

Robert C. Aitken, "A Comparison of Defect Models for Fault Location with Iddq Measurements," Design Technology Center—Hewlett–Packard Co., International Test Conference 1992, Paper No. 36.3, pp. 778–787, © 1992 IEEE (Month Unavailable).

Steven D. Millman (Motorola Inc.) and John M. Acken (Intel Corporation), "Diagnosing CMOS Bridging Faults With Stuck–AT, IDDQ, and Voting Model Fault Dictionaries,"IEEE 1994 Custom Integrated Circuits Conference, Paper No. 17.2.1, 17.2.2, 17.2.3, 17.2.4, pp. 409412, © 1994 IEEE (Month Unavailable).

Daniel J. Burns, "Locating High Resistance Shorts in CMOS Circuits by Analyzing Supply Current Measurement Vectors," International Symposium for Testing and Failure Analysis '89, (ISTFA 89), pp. 231–237 (Month Unavailable).

Luther K. Horning, Jerry M. Soden, Ron R. Fritzmeier, and Charles F. Hawkins, "Measurements of Quiescent Power Supply Current for CMOS ICs in Production Testing," Reprinted from Proceedings International Test Conference, 1987, pp. 118–127, ©IEEE 1987 (Month Unavailable).

Charles F. Hawkins, Jerry M.Soden, Ronald R. Fritzemeier, and Luther K. Horning, "Quiescent Power Supply Current Measurement for CMOS IC Defect Detection," *IEEE Transactions on Industrial Electronics*, vol. 36, No. 2, May 1989, pp. 211–218.

Wojciech Maly and Phil Nigh, "Built–In Current Testing—Feasibility Study," Department of Electrical and Computer Engineering, pp. 340–343, ©1988 IEEE (Month Unavailable).

Thomas M. Storey and Wojciech Maly, "CMOS Bridging Fault Detection," International Test Conference 1991, Paper BP1, pp. 1123–1132 (Month Unavailable).

Streejit Chakravarty and Sivaprakasam Suresh (Dept. of Computer Science–State University of New York, Buffalo, NY), "$I_{DDQ}$ Measurement Based Diagnosis of Bridging Faults in Full Scan Circuits," 7th International Conference on VLSI Design, pp. 179–182, Jan. 1994, ©1994 IEEE.

Gattiker, Anne et al., "Current Signatures for Production Testing," 1996 IEEE International Workshop on IDDQ Testing, Oct. 24–25, 1996, pp. 25–28.

Gattiker, Anne E. et al., "Current Signatures," Proceedings 14th IEEE VLSI Test Symposium, Apr. 28–May 1, 1996, pp. 112–117.

* cited by examiner

CURRENT SIGNATURES FOR IDDQ TESTING

BACKGROUND OF THE INVENTION

This invention relates generally to the testing of CMOS integrated circuits, and more particularly the invention relates to the use of power supply current ($I_{DDq}$) measurements for the testing of the integrated circuits.

$I_{DDq}$ testing is a method for testing VLSI circuits by detecting elevated levels of quiescent current caused by defects in the circuit. As applied today, $I_{DDq}$ is measured on a set of test vectors and each measurement from the set is compared to a threshold value. If a measurement is higher than the threshold, the test fails; if all measurements are below the threshold, the test passes.

Despite increasing popularity and ever more widespread use of $I_{DDq}$ testing in recent years, an open question still exists as to what level of current to use as the $I_{DDq}$ pass/fail threshold. Setting the limit incorrectly carries a heavy penalty. If the limit is too high, bad dies may escape testing, which defeats the purpose of $I_{DDq}$ testing aimed at detecting defects that are unlikely to be detected by voltage testing. If the limit is too low, good dies may be rejected, which leads to unnecessary yield loss and, hence revenue loss.

The present invention introduces the notion of a current signature as a means for addressing this problem. The potential of current signatures for allowing dies with harmful defects to be identified—even if they have only a low level of defect current—without imposing a restrictively low pass/fail threshold has been demonstrated via several examples taken from a large CMOS circuit design.

SUMMARY OF THE INVENTION

In accordance with the invention power supply current ($I_{DDq}$) is measured for an integrated circuit undergoing test in response to a plurality of input vectors. The magnitudes of the currents produced by the circuit are compared. A difference between currents is identified as evidence of the presence of an active fault. The active fault current causes steps in the current signature of the device undergoing test. A circuit with an active fault may be less tolerable in the acceptance/rejection criteria than a circuit with no active fault, even if the circuit with no active fault produces a higher level of maximum current, because an active fault results from defects affecting the signal path in the device, which is a high risk and can represent a reliability problem. The location of defects as well as the nature of defects can be determined by comparing a current signature for a device under test with current signatures of circuits having known defects, either by circuit simulation or by previously tested devices with defects.

The invention and objects and features thereof will be more readily apparent from the following detailed description and appended claims when taken with the drawings.

DETAILED DESCRIPTION OF ILLUSTRATIVE EMBODIMENT

Figure 1A:
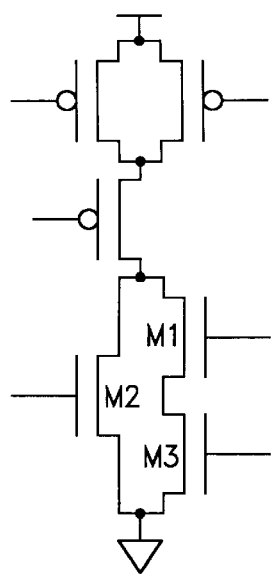
FIGS. 1A–1C illustrate defect-free and defective circuits respectively.

Referring now to the drawings, FIG. 1a shows a defect-free circuit. Since the circuit is fully complementary static CMOS, no input combination will create a static current path from $V_{DD}$ to GND. Therefore, the circuit will produce no static current for any set of inputs applied to it. The circuit in FIG. 1b has a short between the output node of the gate and $V_{DD}$. When the pull-down path is off, there remains no static current path from the output to GND; however, when the pull down path is on, static current will flow through the defect and the pull-down path to GND. Therefore, the circuit will produce static current for some combinations of input, but not for others. Further, there are different combinations of inputs that will turn on the pull-down path. Current will flow as long as there is at least one path to GND turned on, but the amount of current flow may be affected by the number and resistance of the paths that are turned on. Finally, the circuit in FIG. 1c has a short between $V_{DD}$ and GND. Since a static current path exists that involves no transistors, static current will flow for any set of inputs applied to the circuit.

Figure 1B:
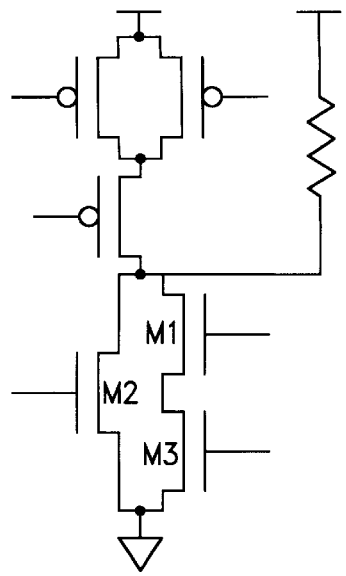
Figure 1C:
Figure 2A:
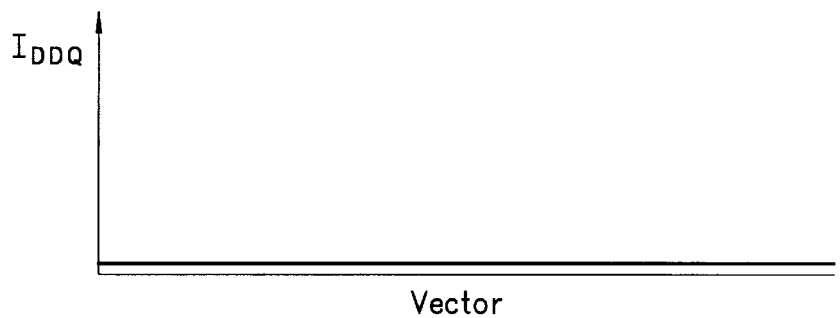
FIGS. 2A–2C illustrate current signature for the circuits of FIG. 1A–1C.
Figure 2B:
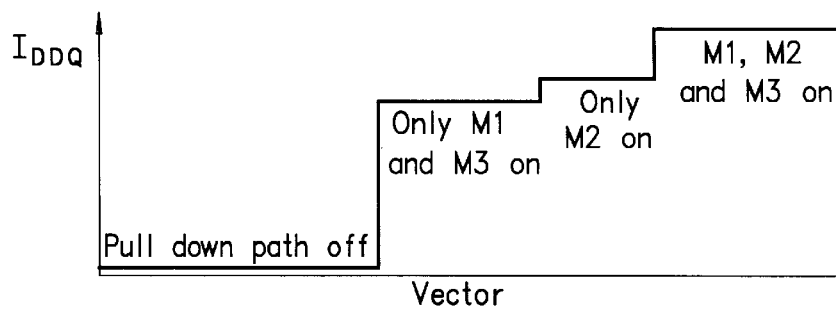
Figure 2C:
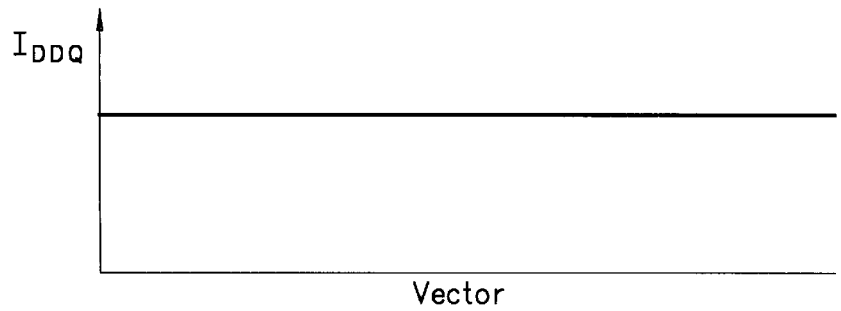

The "current signature" captures the key characteristics of current behavior, such as those that distinguish the three circuits above, by grouping the current measurements into levels, where the measurements in a given level are of the same magnitude. Doing so presents the $I_{DDq}$ results in a form that is useful for observing steps between groups of measurements of similar magnitude. The number of levels of current, along with the magnitude of the levels, comprise the die's current signature. FIG. 2 shows the shapes of the signatures for the circuits in FIG. 1. The circuit in FIG. 1a has a single-level current signature of very low magnitude. The circuit in FIG. 1c has a single-level signature of higher magnitude, depending on the resistance of the short. The circuit of FIG. 1b has a multi-level signature, with a low level corresponding to input combinations that do not turn on the pull-down path and one or more higher levels corresponding to input combinations that turn on the pull-down path.

These examples indicate that current signatures are able to distinguish, first, between "passive" and "active" faults. They do so based on the number of current levels present. Passive faults provide a direct, static current flow path between $V_{DD}$ and GND. They are activated regardless of the state of the circuit or the circuit inputs. Examples of passive faults are shorts between $V_{DD}$ and GND and leaky non-switching reversed-biased pn junctions, such as between the well and substrate. Passive faults produce a constant level of current on all vectors. They result in "no-step" current signatures." FIG. 1c presents an example of a circuit with a passive fault.

Active faults, on the other hand, affect at least one switching node of the circuit. Examples of active faults include shorts between a switching node and any other node (switching or non-switching) and "stuck-on" transistors. Active faults produce abnormal current on vectors that activate them and no abnormal current on vectors that do not activate them. They result in current signature with at least one "step". Active faults tend to be dangerous to a circuit's functioning because they result from defects affecting the signal path. FIG. 1b presents an example of a circuit with an active fault.

Current signatures also provide information on the nature of defects based on the magnitude of currents and the number of unique current levels that are present. For example, the current flowing through a $V_{DD}$-GND short will be determined by the resistance of the short. If the resistance is small, a large current will flow and the voltage levels on the rails may be degraded such that the circuit will not function. If the resistance is very large, however, only a small current will flow and, while power dissipation will be affected, circuit function may be unharmed.

Similarly, the current caused by a resistive short depends on the value of the resistance and/or the value of the resistance of the pull-up or pull-down path through which the current flows. The current flowing through a low resistance short will be limited by the current that can flow through the activated pull-up or pull-down path, which will vary vector-by-vector. FIG. 2b illustrates this fact. The current flowing through a highly resistive short will be determined by the short itself. In addition, the number of current levels of static current produced by a single defect depends on the number of different combinations of transistors that can provide a current path involving the defect. A large number of defect current levels may indicate a large defect that affects a number of gates, a defect on a very complex gate or a defect on a node with a large fan-in or fan-out. A large number of defect levels may also indicate the presence of multiple defects, rather than only a single defect.

While some faults may cause only a low level of current if they are active evidence exists that a defect is present in the signal path. Such a defect is a high risk and, in particular, may represent a reliability problem.

Consider now several examples illustrating the application of the current signature concept. A large size fully static CMOS circuit has been tested with a number of testing methods, including $I_{DDq}$ measurements executed on almost 200 vectors. Voltage tests were also applied. Both $I_{DDq}$ and voltage tests were performed at the wafer and after package and burnin. In this section we present in detail results obtained for four dies, labelled A, B, C and D, in order to illustrate key points of this invention.

Figure 3A:
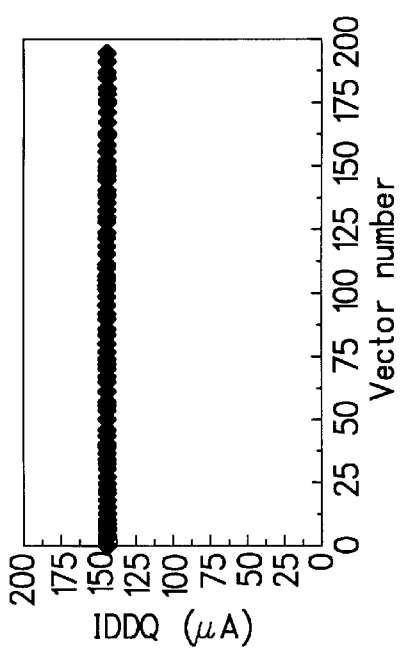
FIGS. 3A,3B illustrate $I_{DDq}$ measurements for a device A and a current signature based thereon.
Figure 3B:
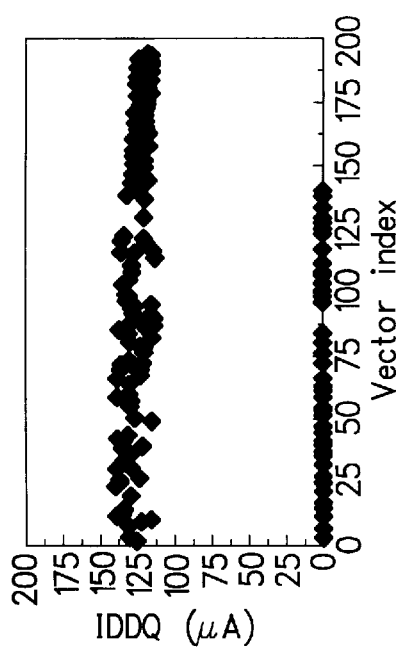

FIG. 3a shows the measurements made during wafer testing on a die labelled A, which failed the voltage tests. In order to see clearly the die's current signature, we order the measurements as shown in FIG. 3b. FIG. 3b shows that there are two levels of current present, one of low value (less than 1 $\mu$A) and the other of relatively high value (around 4.5 mA). The existence of one low and one high level of current for die A indicates the presence of an active defect which causes elevated current on a subset of the vectors and no abnormal current on the other vectors. Since die A's maximum $I_{DDq}$ measurement is much higher than would be expected for a static CMOS die, it would very likely be rejected by a single-threshold current test.

Figure 4A:
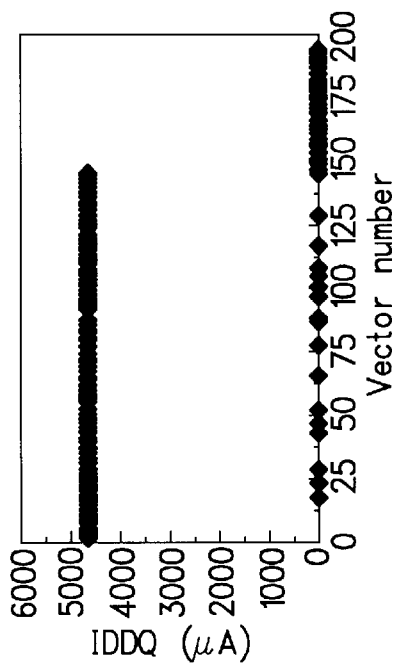
FIGS. 4A,4B illustrate $I_{DDq}$ measurements for two devices B and C.
Figure 4B:
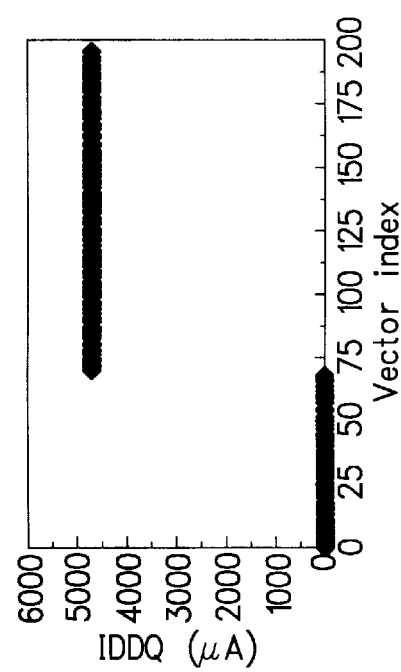

FIGS. 4a and 4b show the currents measured per vector on two other dies, labelled B and C. Die B passed the voltage tests, while die C failed the voltage tests. Both dies have maximum current measurements considerably lower than that of die A-147 $\mu$A for die B and 137 $\mu$A for die C. Using a single current threshold of 100 $\mu$A, both dies would be rejected.

Figure 5A:
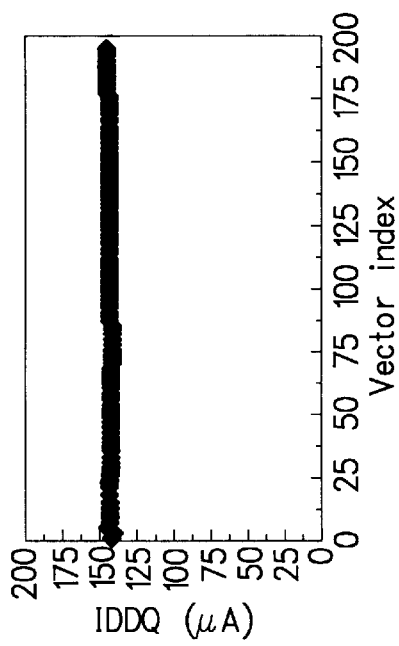
FIGS. 5A,5B illustrate current signatures for the devices B and C based on the current measurements in FIGS. 4A,4B.
Figure 5B:
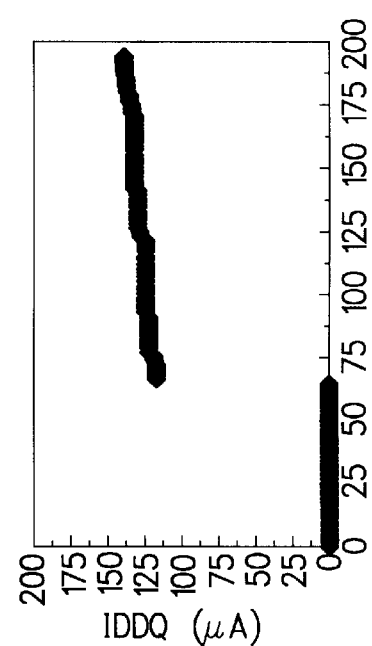

FIGS. 5a and 5b show the die B and C current measurements, ordered. Comparing the two graphs with the measurements ordered, it becomes clear that die C has a jump between a set of low-valued currents and a set of higher-valued currents, indicating the presence of an active defect. The multiple distinct levels of current in the higher step of die C's signature show further that the defect is activated by multiple sets of inputs and that those sets cause different amounts of current flow. The clear presence of an active fault indicates that die C should fail current testing. The fact that the die failed the voltage tests confirms that the die contains a harmful fault.

Die B, on the other hand, appears to have a passive, rather than an active defect. The defect could be in the signal path (e.g. a short between the input and output of an inverter) or it could be outside the signal path (e.g. a leaky well-substrate junction). Note that Die B passed the voltage tests applied. If the defect is in the signal path, it may or may not be detected by voltage testing (10); however, the fact that die B passed all voltage tests applied, including the delay test, combined with the fact that there is an absence of multiple levels in the current signature, makes die B a possible candidate for a class of dies that have current-causing defects that are not in the signal path.

We note that it is not necessarily the case that dies such as die B should be rejected during current testing. In particular, for die B, the low level of current indicates that the defect has a high resistance. If indeed the defect is not in the signal path (e.g. a leaky well-substrate junction) we would not expect such a current to prevent circuit functionality. In other words, die B may be an example of a die that only causes current and is not harmful.

Figure 6A:
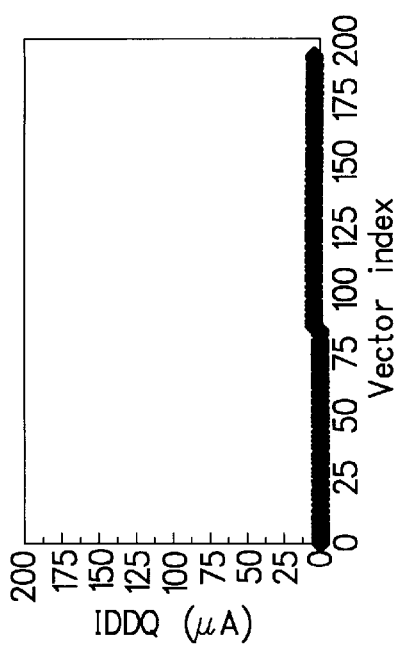
FIGS. 6A,6B illustrate $I_{DDq}$ measurements for another device D before and after voltage stress.

FIG. 6a shows the current signature for another die, labelled D, that has a multi-level current signature. The multi-level signature indicates the presence of a defect, but this die passed the voltage tests. Note that the magnitude of the higher current level is only about 5 $\mu$A. This low current suggests that the defect causing the current is very highly resistive. Nevertheless, the fact that this is an active fault indicates the presence of a defect in the signal path which is likely to be harmful.

Figure 6B:
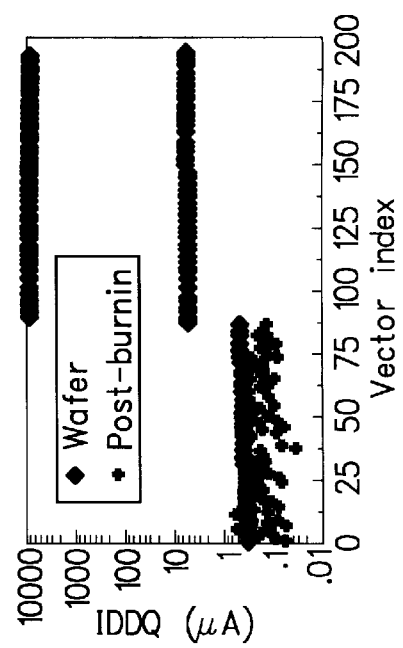

FIG. 6b shows the current measurements taken during wafer testing and adds the measurements taken after the die underwent burn-in. In both cases, the vectors are ordered on the graph in ascending order of the wafer test measurements. Note that the vectors that show a slightly elevated current as the wafer test (~5 $\mu$A) show a markedly higher current after burnin (over 8 mA). The die failed the voltage tests when they were applied after burnin. The fact that the elevated currents occurred on the same vectors indicate that the same mechanism that caused slightly elevated current at wafer test got significantly worse and caused very high currents after burnin. This example demonstrates that some low-current-causing active faults at wafer may become reliability failures. As a result, current signatures taken during wafer testing may provide a powerful tool for predicting reliability failures.

There do exist defects that do not cause abnormal static current to flow. Opens, especially, are candidates for such behavior because they break circuit connections, instead of adding extra ones. Some opens may cause current to flow, however, either because they cause a transistor gate to float in such a way that the transistor is stuck-on, or because they cause an intermediate voltage at a gate input. Note also that current testing using current signature, like all testing, is susceptible to incomplete fault coverage.

Producing a current signature from a die's $I_{DDq}$ results by storing and sorting all measurements is impractical in a production test environment; however, it is possible to apply the differential current scheme suggested by the current signature in a way that captures the essential attributes of a die's current signature, without requiring storage of all measurements or sorting of the measurements. The methodology involves applying $I_{DDq}$ vectors until one of three stopping criteria is met.

As described above, the first, most-easily visible attribute of a current signature is the presence or absence of a "step," where a step indicates the presence of an active defect. The first stopping criterion screens out dies with active defects on the basis of the existence of such a step. The criterion involves detection of an $I_{DDq}$ value that is different from the measurements that proceed it by some threshold value. In practice, this criterion requires storage of only the minimum and maximum values of $I_{DDq}$ seen prior to the current vector and comparison of the current vector to the stored minimum and maximum. An approximate means for carrying out this criterion is to store only the first measurement, compare all subsequent $I_{DDq}$ values to that measurement and stop upon detecting a value that is greater to less than that measurement by a chosen threshold value.

The second stopping criterion addresses "no-step" current signatures. In many situations passive defects causing only low levels of constant current may not harm circuit function, as described in Section 2.2. Dies with such defects should not be rejected during testing. Other situations may exist, however, where some passive defects are unacceptable, for example, if they cause a static power limitation to be violated or present a reliability concern. The second criterion involves detection of a measurement that is above some limit determined by such power dissipation or reliability concerns. This criterion requires only comparison to a reference current value.

The third criterion is detection of a chosen number of measurements of similar magnitude, where the number is chosen to provide acceptable confidence that any further measurements would also produce the same level of current. Meeting the third, but not the first or second stopping criterion, indicates the die contains no unacceptable defects. The length of the test set should be set to this number.

In order to evaluate the feasibility of the proposed die selection methodology, it is necessary to consider test generation, test application and test equipment requirements.

The test generation and application requirements for the proposed methodology are very similar to those of single threshold $I_{DDq}$ testing. To detect a die with an active defect using single-threshold $I_{DDq}$ testing, the test set must contain at least one vector that activates the defect. To detect such a die using the proposed methodology, the test set must also contain a vector that does not activate the defect. This requirement implies also that test generators need a simple modification where the fault coverage metric is related to the number of faults that have been placed both in an active state and an inactive state.

This extra test vector requirement is important only in cases where the activated defect current does not meet the limit set by the second stopping criterion—and these are precisely the cases that would be likely to be missed by a single-threshold test. Since passive defects are activated regardless of the circuit state, only one vector is required for screening dies containing them. The number of vectors required for meeting the third stopping criterion would be the same as the number required for determining a die is defect-free in the case of single-threshold $I_{DDq}$ testing.

One problem with the traditional implementation of $I_{DDq}$ testing is the inability to handle defect-free devices with currents elevated due to the otherwise acceptable process variations. For instance, subthreshold leakage currents can change substantially with relatively small changes in the device channel length. Ideally, in the case of such devices, one would like to accept dies which have elevated leakages caused by normal process variation, but reject those which have high leakages caused by defects. This cannot be accomplished with single-threshold $I_{DDq}$ testing.

Signature-based $I_{DDq}$ testing, on the other hand, can naturally accommodate normal processing variations of sub-threshold leakage. Static CMOS devices with high leakage currents caused by normal process variations will have similar levels of current for all $I_{DDq}$ patterns, but high leakage currents caused by active defects should have substantially different $I_{DDq}$ for some of the test patterns. By applying the first stopping criterion, signature-based $I_{DDq}$ testing has the potential to fail the defective devices and pass the defect-free ones even if the maximum $I_{DDq}$ values are identical.

The application of signature-based $I_{DDq}$ tests can be conducted with a process slightly modified for single-threshold $I_{DDq}$ testing. The procedure can be carried out, for example, using automatic test equipment (ATE) or special-purpose testing circuitry. If ATE is used, one way to implement the differential current scheme suggested by current signatures is to use the ATE to store temporarily the first measurement. Then, during testing, the first step is a simple check of the first measurement versus a maximum value (second stopping criterion). All subsequent measurements can then compared against both a maximum current threshold and against a minimum current threshold (first stopping criterion). Note that the maximum current threshold can be calculated based on the minimum of the upper threshold (given by the first stopping criterion) and a maximum value (given by the second stopping criterion). Hence, after the first measurement, criteria one and two can be checked simultaneously. This procedure does not necessarily place new requirements on ATE.

Current signatures can also be applied for determining the location on a manufactured die of a defect. Currently used techniques for defect location suffer when the set of potential defects pointed to by the results of testing is too large, i.e., the resolution is too low. Better defect location resolution could be achieved by having a more detailed description of the testing results expected from a defect or set of defects. Current signatures provide that resolution. The current signature description provides information on the multiplicity of current levels (1 or more) produced by a single defect.

There has been described a novel method of using power supply current in response to test vectors for acceptance testing of CMOS integrated circuit die. While the invention has been described with respect to specific embodiments, the description is illustrative of the invention rather than limiting the invention. Various modifications and applications may occur to those skilled i the art without departing from the true spirit and scope of the claims as defined by the appended claims.

What is claimed is:

1. A method of testing an integrated circuit based on analysis of power supply current during test, said method comprising the steps of:

a) connecting the integrated circuit to a power supply;

b) applying a plurality of test vectors to said integrated circuit;

c) measuring quiescent power supply current for each test vector;

d) analyzing variations in quiescent power supply current for the plurality of test vectors to determine the presence of one or more active faults, the step of analyzing including:

e) determining a maximum static current common to all vectors as passive fault current;

f) determining current above the maximum static current for each vector as an active fault current;

g) analyzing passive fault current against a first predetermined maximum current value, and h) analyzing active fault current against a second predetermined maximum allowable current value.

2. The method as defined by claim 1 wherein the second maximum current value is lower than the first predetermined maximum current value.

3. The method as defined by claim 1 wherein the integrated circuit uses complementary MOS technology.

4. The method as defined by claim 1 wherein a current signature for each integrated circuit device tested is formed by reordering measured currents based on current magnitudes.

5. The method as defined by claim 4 and further including the step:

e) determining locations of defects in said integrated circuit by comparison of measured power supply currents of said integrated circuit with current signatures of integrated circuits with known defects.

6. In the testing of CMOS integrated circuit die, a method of establishing current signatures for use in defect diagnosis die comprising the steps of:

a) measuring quiescent power supply current for a plurality of die in response to a plurality of test vectors, said plurality of die having known defects, b) determining static current common to a die in response to all test vectors as passive fault current, and c) determining static current above the passive fault current for each test vector as an active fault current.

7. The method as defined by claim 6 wherein said die is based on circuit simulation.

8. The method as defined by claim 7 wherein said die is an integrated circuit integrated circuits having known defects.

9. The method as defined by claim 6 and further including the step of:

d) for each die partitioning test vectors into groups where test vectors in each group produce a same level of static current or a current signature level.

10. A method of defect analysis in an integrated circuit based on power supply currents in response to a plurality of test vectors comprising the steps of:

a) connecting the integrated circuit to a power supply;

b) applying a plurality of test vectors to said integrated circuit;

c) measuring quiescent power supply current for each test vector;

d) establishing a current signature for the integrated circuit based on current levels for the applied plurality of test vectors, and e) comparing the current signature to current signatures for integrated circuits have known defects to identify defects in the integrated circuit.

11. The method as defined by claim 10 wherein location of a defect in an integrated circuit is determined by comparison of current signature of the integrated circuit with current signatures of integrated circuits having known defects.

12. The method as defined by claim 10 wherein type of defect is determined by comparison of current signature of the integrated circuit with current signatures of integrated circuits having known defects.

13. The method as defined by claim 11 wherein number of current levels in the current signature indicates size of an area defect or multiple defects.

* * * * *